United States Patent [19]
Solomon

[11] 3,973,997
[45] Aug. 10, 1976

[54] THERMOCOUPLE WITH IMPROVED HOT JUNCTION

[75] Inventor: Ralph E. Solomon, Claremont, Calif.

[73] Assignee: Jade Controls, Inc., Montclair, Calif.

[22] Filed: June 24, 1974

[21] Appl. No.: 482,009

[52] U.S. Cl. .............................. 136/228; 136/201; 136/236 R; 136/237
[51] Int. Cl.[2] .................. H01L 35/04; H01L 35/14
[58] Field of Search ........... 136/237, 228, 219, 201, 136/236

[56] References Cited
UNITED STATES PATENTS

| | | | |
|---|---|---|---|
| 2,496,346 | 2/1950 | Haayman et al. | 136/237 |
| 2,943,132 | 6/1960 | Jackson | 136/219 |
| 3,556,864 | 1/1971 | Wagner | 136/228 |
| 3,814,634 | 6/1974 | Burket et al. | 136/219 |

*Primary Examiner*—Maynard R. Wilbur
*Assistant Examiner*—Richard E. Berger
*Attorney, Agent, or Firm*—Gausewitz, Carr & Rothenberg

[57] ABSTRACT

An improved hot junction construction for thermocouples is provided by means of a tight fitting internal tube positioned over the outer end of the thermocouple wire prior to its fusion with the tip tube. The internal tube is formed of an alloy, such as an iron alloy containing chromium and nickel, such that the components thereof form a metal solution with the components of the thermocouple wire, which may be of a nickel-containing alloy such as copper-nickel alloy, and the external tube formed, for example, of an iron-chromium alloy. When the outer ends of the wire, internal tube and tip tube are fused, a hot junction is produced which is substantially free of pores, gaseous inclusions and stresses.

20 Claims, 5 Drawing Figures

U.S. Patent  Aug. 10, 1976  3,973,997
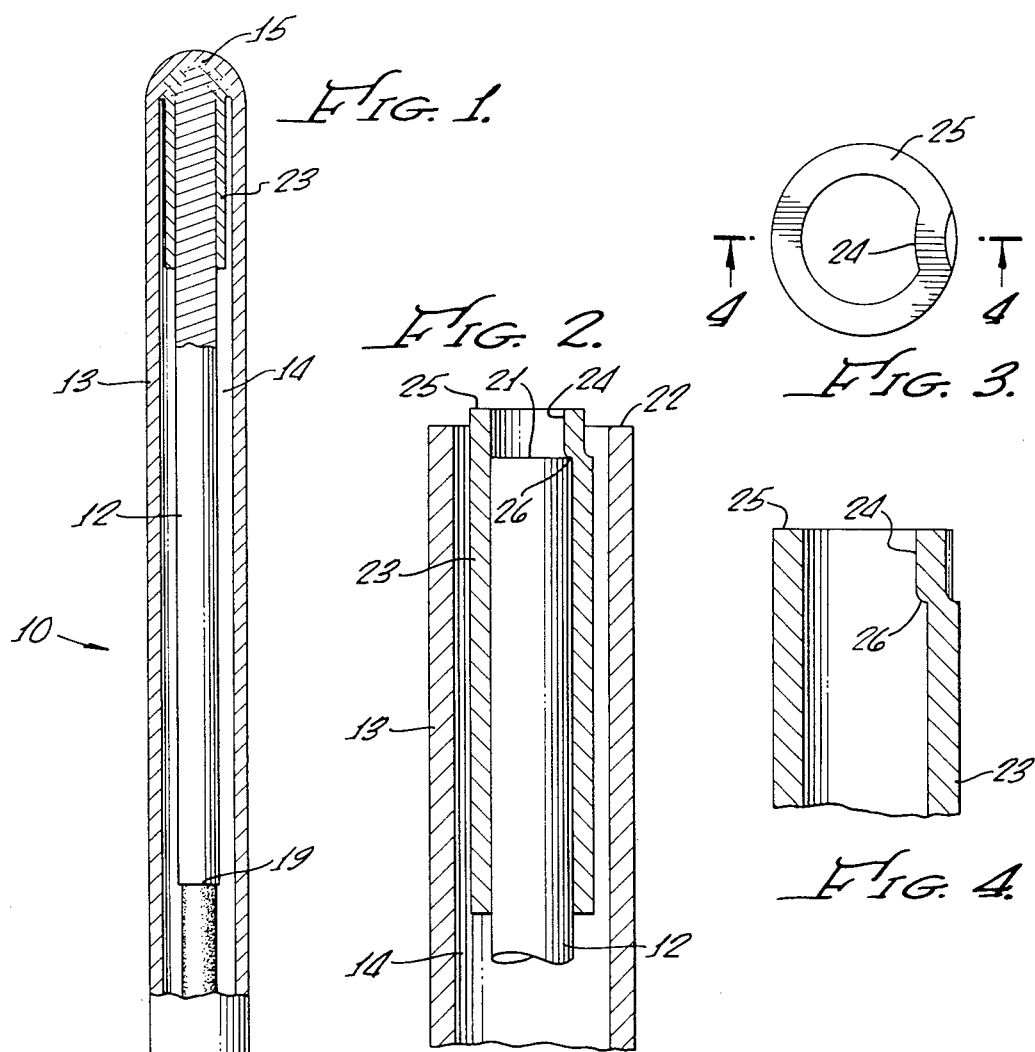
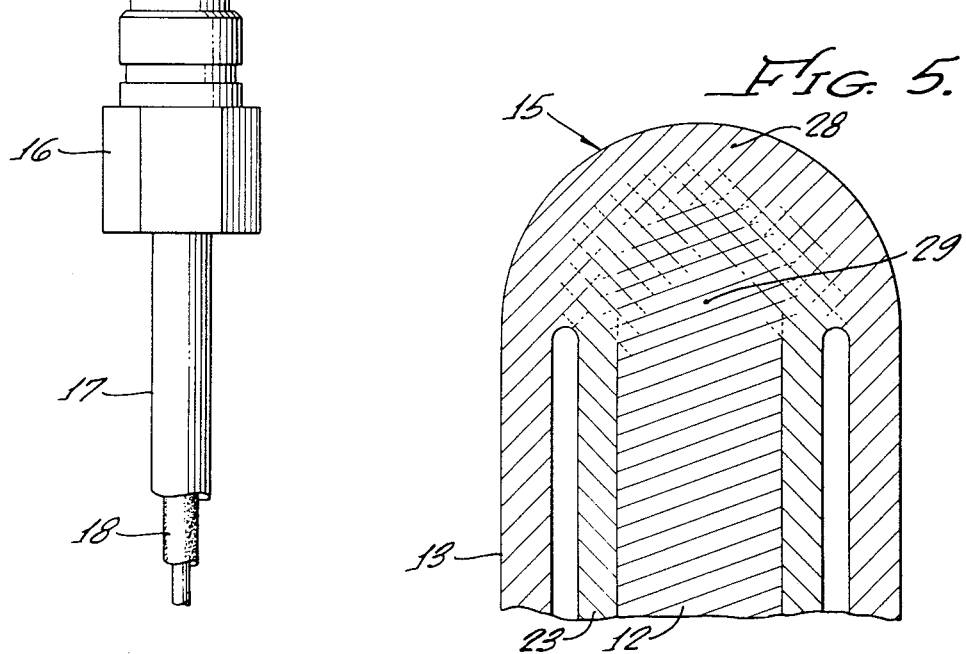

3,973,997

THERMOCOUPLE WITH IMPROVED HOT JUNCTION

BACKGROUND OF THE INVENTION

1. Field of the Invention

This invention relates to thermocouple construction, particularly the construction of the hot junction of the thermocouple.

2. Description of the Prior Art

In prior art construction of thermocouples for use with gas appliances, a thermocouple wire is positioned within a tip tube with the ends of the wire and tube being fused to form the hot junction. Because the internal thermocouple wire is basically a nickel-containing alloy, such as an alloy of copper and nickel, and the external tip tube is generally an alloy of iron and chromium, the metallurgical properties of the fused heterogeneous metals forming the hot junction are not the most desirable for this purpose. In many instances, the interface between the fused alloys contains minute holes and gas pockets. If the joint is not properly annealed, high joint stresses result. These conditions cause accelerated thermal deterioration and short service life. Thermal corrosion of the thermocouple wire also may occur in the vicinity of the hot junction where the temperatures and stresses are highest. Further, in such thermocouples, because the internal wire is composed of a nickel-containing alloy, there is the nickel present at the surface of the fused joint. When the hot junction is inserted into a flame, such as the pilot of a gas appliance, the exposed nickel functions as a catalyst in cracking the natural gas fuel, producing carbon and carbon monoxide. Such carboning of the thermocouple is very undesirable in gas appliance uses.

It is accordingly a particular object of the present invention to provide a novel improved hot junction construction for a thermocouple, having improved properties such as substantial freedom from internal porous imperfections and stresses, providing a thermocouple of increased durability and longer life, yet which can be easily and economically fabricated by relatively simple procedure.

SUMMARY OF THE INVENTION

The present invention provides an improved hot junction through the use of an intermediary member that enters the solution at the fused joint. This member has solution properties compatible with the solution properties of both the tip tube and the internal thermocouple wire, facilitating the formation of a fused joint that overcomes the difficulties encountered with prior designs.

This is accomplished by positioning a tight-fitting, relatively short tube over the end of the thermocouple wire prior to the fusion of the hot junction. This tube has the solution properties noted above so that a metal solution forms which is substantially free of the porous, gaseous inclusions and stresses which are characteristic of prior art thermocouple hot junctions. Further, the closely fitting internal tube at the hot extremity of the thermocouple forms an oxidation shield, minimizing thermal corrosion and greatly extending the thermocouple life.

The thermocouple wire may be formed of a nickel-containing alloy such as "Copel", which is comprised of about 55 percent copper, 45 percent nickel and about 0.8 percent silicon and essential trace metals. The tip tube of the thermocouple is composed of an iron-chromium alloy such as a chromium-containing steel. For this purpose, a high chromium stainless steel is preferred, such as Type 446 stainless steel containing 23–27 percent chromium, the balance being iron and essential trace metals. However, other chromium-containing iron alloys or steels can be utilized.

The internal tube positioned over the end of the thermocouple wire preferably is an iron alloy containing additional metal components common to certain of the components of the thermocouple wire and of the tip. Thus, the internal tube is composed of an iron alloy containing chromium and nickel, the latter components being present in the alloy of the tip and of the thermocouple wire, respectively. The internal tube is preferably composed of a stainless steel containing 12 to 15 percent chromium and 2½ percent nickel, the balance being iron and essential trace metals. The internal tube can be comprised of any equivalent alloy which contains chromium and nickel and which will fuse together with the nickel-containing alloy of the thermocouple wire and the chromium-containing iron alloy of the external tip tube, to provide an improved fused hot junction having the highly desirable properties of the hot junction of the invention.

The nickel present in the chromium-nickel alloy, or stainless steel, of which the internal tube is composed, functions as a solution aid for the nickel present in the nickel-containing alloy of the thermocouple wire. The chromium present in the chromium-nickel alloy, or stainless steel, of the internal tube functions as a solution aid for the chromium present in the iron-chromium alloy of the external tube.

The parts are positioned, before the fusion of the joint, with the end of the tip tube extending beyond the end of the thermocouple wire and the internal tube projecting beyond both. After this, when the adjacent ends of the assembly of the thermocouple wire, the internal tube and the external tip tube are welded to form the hot junction, there is formed a graded material wherein the chromium contained in the internal tube and in the external tip tube is concentrated in the form of a chromium solution adjacent the outer surface of the assembly, and the nickel present in the chromium-nickel alloy of the internal tube is concentrated in the form of a nickel solution adjacent the interior of the hot junction assembly adjacent the end of the thermocouple wire. The result is an ideal metal solution which is substantially free of porous imperfections and gaseous inclusions. Residual stresses are absent. The current generating capability of the completed thermocouple is unimpaired.

Because of the graded composition of the hot junction, there is virtually no nickel exposed directly to the natural gas fuel and the combustion gases of the flame when the thermocouple is in use with a gas appliance. This is because of the concentration of the nickel at the interior of the hot junction, rather than at is outer surface. Hence, there is no nickel present to act as a catalyst and cause cracking of the natural gas into carbon and carbon monoxide.

BRIEF DESCRIPTION OF THE DRAWINGS

FIG. 1 is a longitudinal section view, partially in elevation, of a thermocouple construction according to the invention;

FIG. 2 is an enlarged fragmentary section view showing the relation of the adjacent ends of the thermocouple wire, the internal tube and the external tip tube, just prior to fusion thereof;

FIG. 3 is an enlarged end view of the internal tube employed in the assembly of FIG. 2;

FIG. 4 is a longitudinal sectional view of the internal tube taken along line 4—4 of FIG. 3; and FIG. 5 is an enlarged sectional view of the completed hot junction of the thermocouple.

DESCRIPTION OF THE PREFERRED EMBODIMENTS

Referring to FIG. 1, the thermocouple 10 according to the invention includes a thermocouple wire 12 of the copper-nickel alloy noted above, and a tubular thermocouple tip 13 formed of the iron-chromium alloy, Type 446 stainless steel, also noted above. The wire 12 is spaced from the inner surface of the tip tube 13 to provide an annular space 14. At the outer end of the thermocouple, the wire 12 and tip 13 are fused or welded together to form the hot junction 15 of the thermocouple, as will be explained more fully below.

The inner end of the tip 13 is connected to a base fitting 16, from which extends a tube 17, normally of copper that is for connection to the appliance (not shown). An insulated conductor wire 18 also comes from an insulated contact (not shown) through the tube 17 and into the tip 13. The wire insulation is removed from the end of the conductor wire 18, which is connected to the thermocouple wire 12 at a cold junction 19.

Before the hot junction 15 is formed, the thermocouple wire 12 is positioned at the axis of the tip 13, the outer end 21 of the wire being spaced a short distance inwardly of the outer end 22 of the tip, which at that time is open (see FIG. 2). A short tube 23 is fitted closely over the end of the thermocouple wire 12, with the outer end of the tube 23 projecting beyond both the end 21 of the wire 12 and the end 22 of the tip 13. The tube 23 is of the stainless steel discussed above, which contains both chromium and nickel, and has a wall thickness less than that of the tip tube 13. The relative spacing of the ends of these parts depends upon their dimensions and materials. In a typical example, the end 22 of the tip 13 is 0.031 inch beyond the end 21 of the wire 12, with the end 25 of the tube 23 being 0.015 inch outwardly of the tip end.

In order to locate the tube 23 accurately with respect to the ends 21 and 22 of the thermocouple wire 12 and tip 13, it is given an indentation 24 adjacent its outer end 25. This forms a shoulder 26 at predetermined distance from the end 25 of the tube 23. This shoulder forms an abutment that is brought into engagement with the end 21 of the thermocouple wire 12, axially positioning the tube 23. Internally, the tube 23 is substantially complementary to the thermocouple wire, while its outer surface is spaced from the inner wall of the tip 13. As positioned on the thermocouple wire 12, the tube 23 is attached to the wire by stored energy welding.

With the thermocouple wire 12, tip 13 and tube 23 positioned as shown in FIG. 2, the end portions of these three elements are fused together to form the hot junction 15. Such fusion may be carried out in any suitable manner, a preferred mode being by heliarc welding. An argon atmosphere is used to prevent oxidation during welding and immediately after welding as the hot junction is cooled.

During the welding procedure, the end portion of the internal tube 23, which extends beyond the end 21 of the wire 12, collapses inwardly as it becomes molten, entering into solution with the adjacent end of the wire 12, which also is molten. The outwardly extending end portion of the tip 13 also collapses inwardly and enters into solution with the outer molten part of the internal tube 23. In sequence, the internal tube 23 melts before the tip 13 so that the molten material of the tube 23 covers the end of the wire 12 before the melting of the tip. Consequently, the material of the tube 23 forms a barrier between the molten tip material and the molten wire material. A convex meniscus is formed as the welding takes place, so that the resulting hot junction is semispherical as shown.

Upon cooling, the end portions of the three elements 12, 13 and 23 form a solid metal solution in providing the hot junction 15. This is a graded material wherein the chromium contained in the internal tube 23 is concentrated with the chromium in the tip tube 14 as a chromium iron solution in the region 28 toward the outer surface of the hot junction 15. The nickel present in the chromium-nickel alloy of the internal tube 23 is concentrated with the nickel in the copper-nickel alloy of the wire 12, in the form of a nickel-copper solution in the interior zone 29 of the hot junction 15, adjacent the end of the thermocouple wire 12. The interface between the solution regions 28 and 29 is a homogeneous union of the major elements chromium, iron, nickel and copper, providing the graded metal solution.

From the foregoing, it is seen that the invention provides a hot junction construction for thermocouples, having improved and superior properties with respect to strength and durability, in comparison with prior art hot junction constructions, and can be readily formed from presently available materials by a novel simple procedure.

The foregoing detailed description is to be clearly understood as given by way of illustration and example only, the spirit and scope of this invention being limited solely by the appended claims.

I claim:

1. In a thermocouple, a hot junction comprising
  a first member of a first electrically conductive metal alloy,
  a second member of a second electrically conductive metal alloy,
  and a third member of a third electrically conductive metal alloy,
    said first, second and third members being fused together to form a unitary fused joint,
    said first, second and third metal alloys being different from each other,
    said second metal alloy having solution properties compatible with the solution properties of said first metal alloy and solution properties compatible with the solution properties of said third metal alloy.

2. A device as recited in claim 1 in which said first member is a wire, said third member is a tube circumscribing said wire in spaced relationship therewith, and said second member is a tube substantially complementarily receiving said wire and in spaced relationship with said first mentioned tube adjacent said fused joint.

3. In a thermocouple construction, an assembly comprising
  a conductive thermocouple wire,
  an external tip tube around said wire, and an internal tube within said external tip tube and closely fitted over the outer end portion of said wire, the adjacent outer ends of said wire, said internal tube and said external tube being fused to form a unitary joint providing a hot junction, said wire, said external tube and said internal tube being formed of different metal alloys, said internal tube being formed of an alloy containing components such that during fusion a metal solution is formed with components of said internal tube and components of said external tube, and with additional components of said internal tube and components of said wire.

4. A thermocouple construction as defined in claim 3 in which said thermocouple wire is formed of a nickel-containing alloy, said external tube formed of an chromium-containing alloy, and said internal tube is formed of a chromium-nickel-containing alloy.

5. A thermocouple construction as defined in claim 4, in which said chromium-nickel-containing alloy of said internal tube is in solution with said nickel-containing alloy of said thermocouple wire and with said chromium-containing alloy of said external tube at said fused joint.

6. A thermocouple construction as defined in claim 5, in which said fused joint is comprised of a graded material wherein the chromium content of said internal tube and said external tube are concentrated adjacent the outer surface of said fused joint, and the nickel content of said internal tube and of said wire is concentrated in the interior of said fused joint adjacent said wire.

7. A thermocouple construction as defined in claim 3, in which said internal tube is formed of an iron alloy containing chromium and nickel.

8. A thermocouple construction as defined in claim 3, in which said thermocouple wire is formed of a copper-nickel alloy, said internal tube is formed of an iron alloy containing chromium and nickel, and said external tube is formed of an iron-chromium alloy.

9. A thermocouple construction as defined in claim 6, in which said thermocouple wire is formed of a copper-nickel alloy, said internal tube is formed of an iron alloy containing chromium and nickel, and said external tube is formed of an iron-chromium alloy.

10. A device as recited in claim 9 in which said internal tube has a thinner wall than said external tube.

11. The process of forming a fused joint having a graded solution comprising the steps of positioning a first member of a first metal alloy within a hollow second member of a second metal alloy, positioning a third member of a third metal alloy within said second member and around said first member, said third metal alloy being selected so as to have solution properties compatible with the solution properties of said first metal alloy and compatible with the solution properties of said second metal alloy, and then fusing said first, second and third members to form a unitary fused joint with components of said second metal alloy being concentrated at the exterior of said joint and components of said first metal alloy being concentrated at internal portions of said joint.

12. The process for providing a hot junction of a thermocouple which comprises placing an internal tube formed of a first metal alloy over a thermocouple wire of a second metal alloy, said internal tube being made shorter than said wire and positioned on said wire so that one end of said internal tube is outwardly a short predetermined distance beyond one end of said wire, placing said wire and said internal tube so positioned thereon within an external tube of a third metal alloy, with the outer end of said external tube extending outwardly a short distance beyond said one end of said wire but for a distance less than said one end of said internal tube, said first metal alloy being selected to have solution properties compatible with the solution properties of said second metal alloy and compatible with the solution properties of said third metal alloy, and forming a unitary fused joint by fusing the outwardly extending end portion of said internal tube to said one end of said wire, and fusing the outwardly extending end portion of said external tube over the fused outer ends of said wire and said internal tube.

13. A process as defined in claim 12 in which said internal tube is formed of an alloy containing chromium and nickel, said thermocouple wire is formed of a nickel-containing alloy, and said external tube is formed of chromium-containing iron alloy.

14. The process for providing a hot junction of a thermocouple which comprises placing an internal tube formed of a first metal alloy over a thermocouple wire of a second metal alloy, said internal tube being made shorter than said wire, forming an abutment means for positioning said internal tube so that one end of said internal tube is outwardly a short predetermined distance beyond one end of said wire, placing said wire and said internal tube so positioned thereon within an external tube of a third metal alloy, with the outer end of said external tube extending outwardly a short distance beyond said one end of said wire but for a distance less than said one end of said internal tube, said first metal alloy being selected to have solution properties compatible with the solution properties of said second metal alloy and compatible with the solution properties of said third metal alloy, and forming a unitary fused joint by fusing the outwardly extending end portion of said internal tube to said one end of said wire, and fusing the outwardly extending end portion of said external tube over the fused outer ends of said wire and said internal tube.

15. The process as recited in claim 14 in which for forming said abutment means an abutment is formed in said internal tube a predetermined distance from said outer end thereof, and said one end of said wire is caused to engage said abutment when said internal tube is so placed over said wire for thereby positioning said internal tube to so extend beyond said one end of said wire.

16. The process as recited in claim 15 in which for forming said abutment an indentation is formed in the wall of said internal tube.

17. A process as defined in claim 13 in which said fusing is carried out by arc welding.

18. The process as defined in claim 13 in which said internal tube is formed of an iron alloy containing chromium and nickel.

19. The process as defined in claim 13 in which said thermocouple wire is formed of a copper-nickel alloy, and said internal tube is formed of an iron alloy containing chromium and nickel.

20. The process as recited in claim 18 in which said internal tube is made to have a thinner wall than that of said external tube.

* * * * *